US012721073B2

(12) United States Patent
Kuneshita et al.

(10) Patent No.: US 12,721,073 B2
(45) Date of Patent: Aug. 25, 2026

(54) METHOD OF MANUFACTURING SEMICONDUCTOR DEVICE AND SEMICONDUCTOR DEVICE HAVING TRENCH CONTACT

(71) Applicant: FUJI ELECTRIC CO., LTD., Kawasaki (JP)

(72) Inventors: Naoki Kuneshita, Matsumoto-City (JP); Makoto Endou, Matsumoto-City (JP); Atsushi Yoshimoto, Matsumoto-City (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 680 days.

(21) Appl. No.: 17/978,048

(22) Filed: Oct. 31, 2022

(65) Prior Publication Data

US 2023/0178377 A1 Jun. 8, 2023

(30) Foreign Application Priority Data

Dec. 3, 2021 (JP) ................................ 2021-197346

(51) Int. Cl.
*H10D 12/00* (2025.01)
*H10P 50/00* (2026.01)
(Continued)

(52) U.S. Cl.
CPC .......... *H10P 50/283* (2026.01); *H10P 50/287* (2026.01); *H10P 50/71* (2026.01); *H10P 50/73* (2026.01); *H10P 76/4085* (2026.01)

(58) Field of Classification Search
CPC .. H10D 12/032; H10D 12/035; H10D 12/038; H10D 12/441; H10D 12/481
See application file for complete search history.

(56) References Cited

U.S. PATENT DOCUMENTS 6,284,148 B1 9/2001 Laermer et al.
2004/0164349 A1* 8/2004 Nishiwaki ............ H10D 12/038 257/E29.037
(Continued)

FOREIGN PATENT DOCUMENTS

JP S63110746 A 5/1988
JP 2006140239 A * 6/2006
(Continued)

OTHER PUBLICATIONS

Office Action of Japanese Patent Application No. 2021-197346 dated Sep. 9, 2025.
(Continued)

*Primary Examiner* — Reema Patel
(74) *Attorney, Agent, or Firm* — Rabin & Berdo, P.C.

(57) ABSTRACT

A first semiconductor region of a second conductivity type, a second semiconductor region of a first conductivity type, gate trenches, a gate insulating film, gate electrodes, and an interlayer insulating film are formed. Next, a contact hole that penetrates through the interlayer insulating film and reaches the first semiconductor region is formed, and in a surface layer of the first semiconductor region exposed at a bottom of the contact hole, a third semiconductor region of the second conductivity type is formed by an ion implantation using, as a mask, a polymer formed herewith; and after the ion implantation, the polymer is removed. Next, a fourth semiconductor region of the second conductivity type, a first electrode, and a second electrode are formed.

10 Claims, 8 Drawing Sheets

(51) Int. Cl.
*H10P 50/28* (2026.01)
*H10P 76/40* (2026.01)

(56) References Cited

U.S. PATENT DOCUMENTS

| | | | |
|---|---|---|---|
| 2017/0162564 | A1 | 6/2017 | Aketa et al. |
| 2018/0366548 | A1 | 12/2018 | Naito |
| 2019/0067029 | A1 | 2/2019 | Kuneshita |

FOREIGN PATENT DOCUMENTS

| | | | |
|---|---|---|---|
| JP | 4674368 | B2 | 4/2011 |
| JP | 2011171632 | A | 9/2011 |
| JP | 2013110373 | A | 6/2013 |
| JP | 2019046834 | A | 3/2019 |
| JP | 2019068096 | A | 4/2019 |
| WO | 2018052099 | A1 | 3/2018 |

OTHER PUBLICATIONS

Office Action issued for corresponding Japanese Patent Application No. 2021-197346 dated Nov. 18, 2025.

* cited by examiner

FIG.7
RELATED ART

FORM FRONT DEVICE ELEMENT STRUCTURE
S101
FORM INTERLAYER INSULATING FILM
S102
PATTERNING
S103
DRY ETCH INTERLAYER INSULATING FILM
S104
DRY ETCH TRENCHES
S105
REMOVE RESIST FILM
S106
REMOVE POLYMER
S107
FORM CONTACT REGIONS
S108
ANNEALING TREATMENT
S109

METHOD OF MANUFACTURING SEMICONDUCTOR DEVICE AND SEMICONDUCTOR DEVICE HAVING TRENCH CONTACT

CROSS REFERENCE TO RELATED APPLICATIONS

This application is based upon and claims the benefit of priority of the prior Japanese Patent Application No. 2021-197346, filed on Dec. 3, 2021, the entire contents of which are incorporated herein by reference.

BACKGROUND OF THE INVENTION

1. Field of the Invention

Embodiments of the invention relate toa method of manufacturing a semiconductor device and a semiconductor device.

2. Description of the Related Art

In a conventionally known semiconductor device, a polysilicon (poly-Si) diode such as that for a temperature sensor is provided, via an insulting layer, on a front surface of a semiconductor substrate (semiconductor chip) having an insulated gate bipolar transistor (IGBT) with a trench gate structure or metal oxide semiconductor field effect transistor (MOSFET).

In such a semiconductor device, normally, as a method of forming a contact hole for contact (electrical contact) with an electrode layer, typically, an oxide film that covers the front surface of the semiconductor substrate is selectively removed by dry etching using a resist film as a mask. The contact hole is a groove that reaches a silicon (Si) portion such as an emitter region, a polysilicon layer such as a gate electrode, etc.

With the advancement of miniaturization of IGBTs, problems such as reduced latch-up tolerance due to increased resistance accompanying reductions in contact size are of concern and contact resistance has to be reduced. As one measure, contacts are processed from a conventional planar type into a trench-shape, whereby the resistance is decreased by increasing the surface area by contact at not only a bottom but also at sidewalls. Further, for planar type contacts and for trench type contacts, after processing, the contact resistance is typically reduced by increasing an impurity concentration to $10^{20}/cm^3$ by ion implantation of an impurity.

Figure 7:
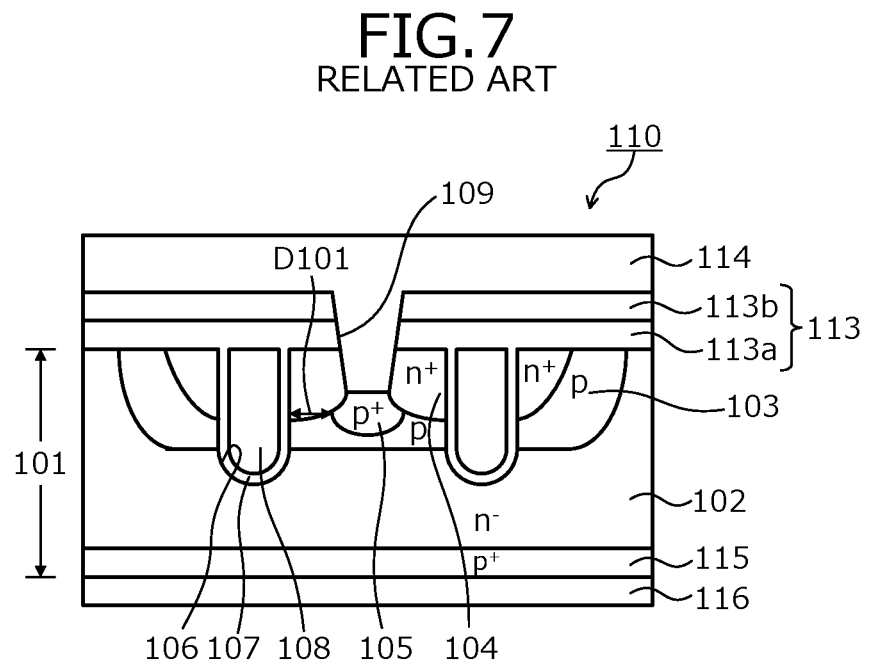

FIG. 7 is a cross-sectional view depicting a structure of a conventional semiconductor device. A trench gate IGBT 110 is depicted as the conventional semiconductor device. The trench gate IGBT 110 has a MOS gate portion constituted by a p-type base region 103, an $n^+$-type emitter region 104, a $p^+$-type contact region 105, trenches (gate trenches) 106, a gate insulating film 107, and gate electrodes 108, at a front side of a semiconductor substrate 101. The p-type base region 103 is selectively provided in a surface layer of the semiconductor substrate 101, at a front surface of the semiconductor substrate 101. A portion of the semiconductor substrate 101 excluding the p-type base region 103 and a later-described $p^+$-type collector region 115 is an n-type drift region 102. At the front side of the semiconductor substrate 101, the $n^+$-type emitter region 104 and the $p^+$-type contact region 105 are each selectively provided in the p-type base region 103 in a surface layer of the semiconductor substrate 101.

The gate trenches 106 penetrate through the $n^+$-type emitter region 104 and the p-type base region 103, and reach the n-type drift region 102. The gate insulating film 107 is provided along inner walls of the gate trenches 106. The gate electrodes 108 are provided on the gate insulating film 107, in the gate trenches 106. The gate electrodes 108 face the $n^+$-type emitter region 104 with the gate insulating film 107 at sidewalls of the gate trenches 106 intervening therebetween.

Between adjacent gate trenches of the gate trenches 106 (mesa region), a contact hole 109 is provided apart from the gate trenches 106. At sidewalls of the contact hole 109, the $n^+$-type emitter region 104 is exposed while at a bottom, the $p^+$-type contact region 105 is exposed.

On a front surface of the semiconductor substrate 101, an interlayer insulating film 113 is provided so as to cover the gate electrodes 108. On the interlayer insulating film 113, an emitter electrode 114 is provided. The emitter electrode 114 is embedded in the contact hole 109 and at an inner wall of the contact hole 109, is in contact with and electrically connected to the $n^+$-type emitter region 104 and the $p^+$-type contact region 105.

In a surface layer of the semiconductor substrate 101, at a back surface of the semiconductor substrate 101, the $p^+$-type collector region 115 is provided. A collector electrode 116 is provided in an entire area of the back surface of the semiconductor substrate 101. At the back surface of the semiconductor substrate 101, the collector electrode 116 is in contact with and electrically connected to the $p^+$-type collector region 115.

Next, a method of manufacturing the conventional semiconductor device is described. FIG. 8 is a flowchart depicting an outline of the method of manufacturing the conventional semiconductor device. FIGS. 9, 10, and 11 are cross-sectional views depicting states of the conventional semiconductor device during manufacture. First, as depicted in FIG. 9, at the front side of the semiconductor substrate 101, a front surface element structure such as the MOS gate portion of the trench gate IGBT 110 is formed (step S101).

Next, in the entire front surface of the semiconductor substrate 101, the interlayer insulating film 113 constituted by a high temperature oxide (HTO) film 113*a* and borophosphosilicate glass (BPSG) 113*b* is formed (step S102). Next, the interlayer insulating film 113 is planarized by a heat treatment (reflow) or chemical mechanical polishing (CMP), etc.

Next, a resist film 118 is formed on the interlayer insulating film 113, and patterning by photoresist application, exposure, and a developing process is performed (step S103), thereby opening a portion that corresponds to the contact hole 109. Next, the resist film 118 is used as a mask, and dry etching using, for example, trifluoromethane ($CHF_3$) gas is performed, thereby forming a hole that penetrates through the interlayer insulating film 113 in a depth direction and reaches the surface of the semiconductor substrate 101 (step S104). Next, dry etching is performed, thereby forming the contact hole 109 that penetrates through the interlayer insulating film 113 in the depth direction and reaches the p-type base region 103 and the $n^+$-type emitter region 104 (step S105).

The dry etching for forming the contact hole 109 includes alternately performing, repeatedly, an etching process of selectively removing the interlayer insulating film 113 or the semiconductor substrate 101 by a Bosch process and thereby, increasing a depth of the contact hole 109 and a deposition process of depositing a polymer 117 on the sidewalls of the contact hole 109 to, thereby, protect the sidewalls of the contact hole 109. Therefore, the polymer 117 remains on the sidewalls of the contact hole 109.

Next, as depicted in FIG. 10, the resist film 118 is removed (step S106) and thereafter, the polymer 117 is removed (step S107). Next, as depicted in FIG. 11, a p-type impurity such as boron (B) is implanted by an ion-implantation 119, whereby the $p^+$-type contact region 105 is formed (step S108). Next, a heat treatment (activation annealing) for activating the $p^+$-type contact region 105 formed by the ion implantation 119 is performed (step S109). Thereafter, an electrode layer (not depicted) constituting the emitter electrode 114 is embedded in the contact hole 109, whereby an emitter contact is formed at the sidewalls of the contact hole 109. Finally, the $p^+$-type collector region 115 and the collector electrode 116 are formed at the back surface of the semiconductor substrate 101, whereby the semiconductor device is completed.

Further, a technique of using a single resist film as a mask and forming multiple contact holes of differing depths without removing the semiconductor substrate from the chamber (furnace) to realize reductions in cost and shortening of the lead-time is commonly known (for example, refer to Japanese Laid-Open Patent Publication No. 2019-46834). Further, a technique of forming, in a silicon substrate, a groove that reaches a P-type layer by a reactive ion etching using a gas that forms a polymer, and forming a $P^+$-type channel stopper layer at a bottom of the groove by ion implantation that uses a polymer and a silicon oxide film attached to sidewalls of the groove as a mask is commonly known (for example, refer to Japanese Laid-Open Patent Publication No. S63-110746).

SUMMARY OF THE INVENTION

According to an embodiment of the invention, a method of manufacturing a semiconductor device includes: preparing a semiconductor substrate of a first conductivity type, the semiconductor substrate having a first main surface and a second main surface that are opposite to each other; selectively forming a first semiconductor region of a second conductivity type in the semiconductor substrate, at the first main surface of the semiconductor substrate, the first semiconductor region having a first surface and a second surface that are opposite to each other, the second surface facing the semiconductor substrate; selectively forming a second semiconductor region of the first conductivity type, the second semiconductor region being formed in the first semiconductor region, at the first surface of the first semiconductor region; forming a trench that penetrates through the first semiconductor region and the second semiconductor region, and reaches the semiconductor substrate; forming a gate insulating film in the trench, along a bottom and sidewalls of the trench; forming a gate electrode on the gate insulating film, in the trench; forming an interlayer insulating film that covers the gate electrodes; forming a contact hole that penetrates through the interlayer insulating film and reaches the first semiconductor region; performing an ion implantation using, as a mask, a polymer that is formed together with the contact hole, on sidewalls of the contact hole, and thereby form a third semiconductor region of the second conductivity type in the first semiconductor region that is exposed at a bottom of the contact hole; removing the polymer after performing the ion implantation; forming a fourth semiconductor region of the second conductivity type at the second main surface of the semiconductor substrate; forming a first electrode on a surface of the first semiconductor region and a surface of the second semiconductor region; and forming a second electrode on a surface of the fourth semiconductor region.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 7 is a cross-sectional view depicting a structure of a conventional semiconductor device.

Figures 9, 10:
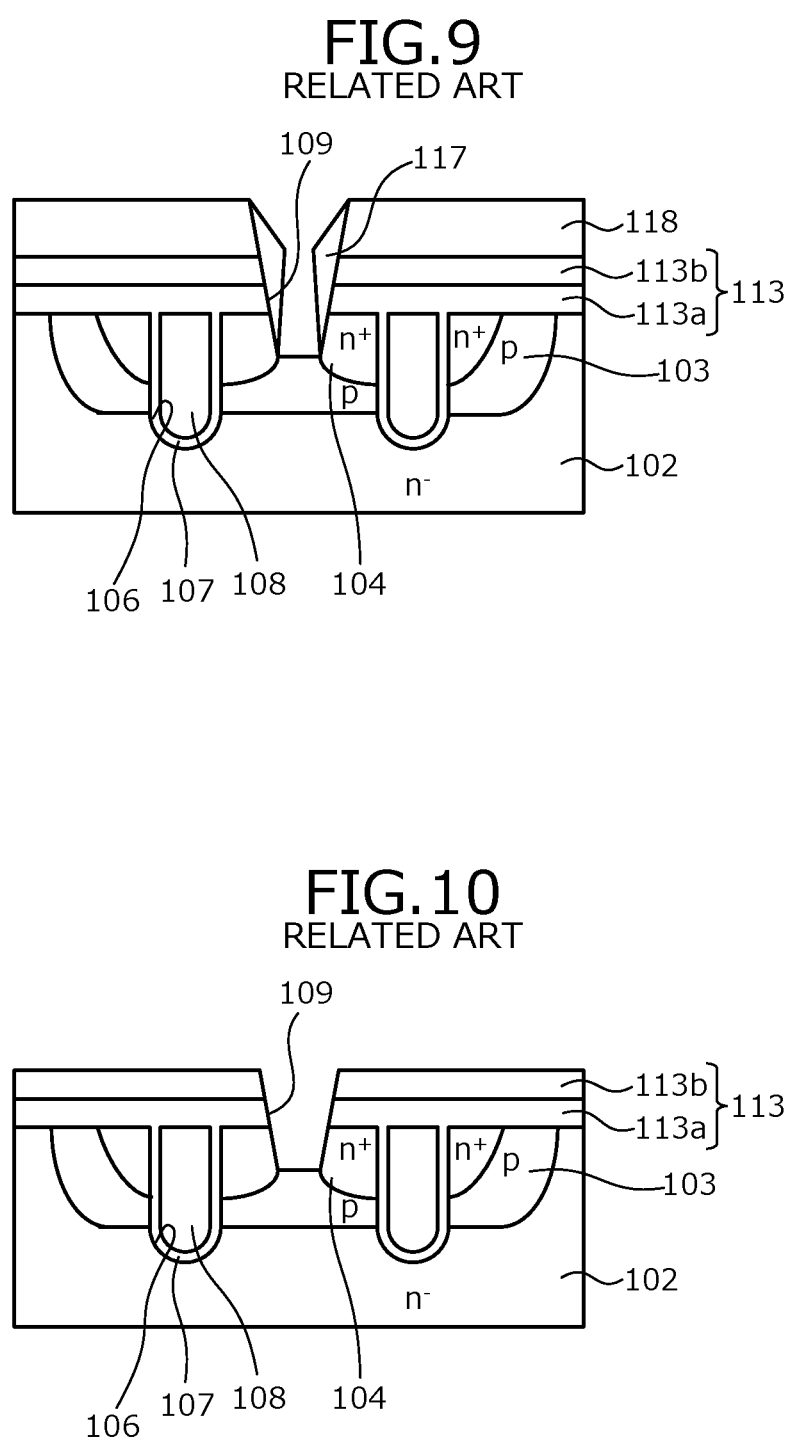

FIG. 9 is a cross-sectional view depicting a state of the conventional semiconductor device during manufacture.

FIG. 10 is a cross-sectional view depicting a state of the conventional semiconductor device during manufacture.

DETAILED DESCRIPTION OF THE INVENTION

Figure 1A:
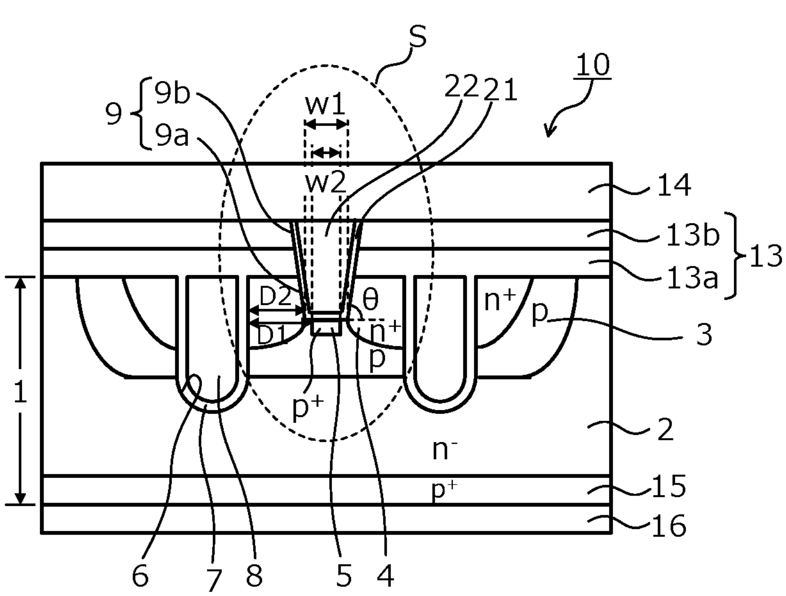
FIG. 1A is a cross-sectional view depicting a structure of a semiconductor device according to an embodiment.

First, problems associated with the conventional techniques are discussed. Conventionally, to lower contact resistance, the $p^+$-type contact region 105 is formed by performing an ion implantation treatment of an impurity such as boron to, thereby, increase surface concentration of the p-type base region 103. In a method by ion implantation, distribution of the impurity in the depth direction in Si depends on the ion species and energy, and ions are distributed according to Gaussian distribution. On the other hand, in Si, scattering occurs and ions also spread in a horizontal direction.

As a result, in the conventional techniques, for example, in an instance in which the contact hole 109 is formed having a trench-shape in a mesa portion of the trench IGBT by selectively etching silicon and ion implantation is performed, the impurity is implanted in an entire area of the bottom of the contact hole 109. At this time, in the Si, the impurity collides with the crystal lattice and scatters, whereby distribution of the impurity at the bottom of the contact hole 109 in the horizontal direction exceeds the width of the bottom of the contact hole 109. Further, the impurity ion-implanted at the bottom of the contact hole 109 is thermally diffused by, for example, a heat treatment that activates the ion-implanted impurity, whereby the impurity is further distributed in the horizontal direction. Therefore, when a distance D101 between the $p^+$-type contact region 105 and the gate trenches 106 decreases, the trench pitch is reduced, and the bottom of the contact hole 109 approaches the channel, the impurity affects channel concentration, thereby, causing Vth (threshold) to change or vary. Therefore, a problem arises in that the width of the $p^+$-type contact region 105 together with dimensions of the contact hole 109 limit reduction of mesa width.

Embodiments of a method of manufacturing a semiconductor device and a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "-" means a bar added to an index immediately after the "-", and a negative index is expressed by prefixing "-" to the index. Further, with consideration of variation in manufacturing, description indicating the same or equal may be within 5%.

Figure 1B:
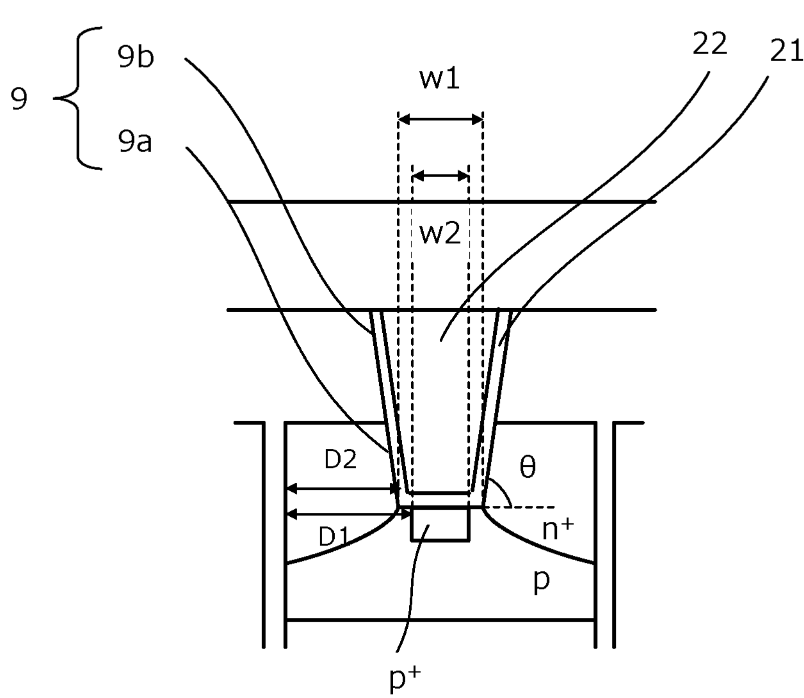
FIG. 1B is an enlarged view of a region S depicted in FIG. 1A.

A semiconductor device according to the present invention is described taking a trench gate IGBT 10 as an example of a semiconductor device fabricated (manufactured) using silicon (Si). FIG. 1A is a cross-sectional view depicting a structure of a semiconductor device according to an embodiment. FIG. 1B is an enlarged view of a region S depicted in FIG. 1A. The semiconductor device according to the embodiment depicted in FIG. 1A is the trench gate IGBT 10 in which a contact between an emitter electrode 14 and a silicon (Si) portion is formed by a trench-contact contact hole 9. In FIG. 1A, only an active region through which a main current of the trench gate IGBT 10 flows is depicted.

The trench gate IGBT 10 is provided on a semiconductor substrate (semiconductor substrate of a first conductivity type) 1. The semiconductor substrate 1 may be a semiconductor wafer having a substantially round shape. The trench gate IGBT 10 may be provided in plural on the semiconductor substrate 1. The semiconductor substrate 1 may be diced to manufacture the trench gate IGBT 10 in plural. The trench gate IGBT 10 includes, at a front side of the semiconductor substrate 1, a MOS gate portion constituted by a p-type base region (first semiconductor region of a second conductivity type) 3, an $n^+$-type emitter region (second semiconductor region of the first conductivity type) 4, a $p^+$-type contact region (third semiconductor region of the second conductivity type) 5, trenches (gate trenches) 6, a gate insulating film 7, and gate electrodes 8. The p-type base region 3 is provided selectively in a surface layer of the semiconductor substrate 1, at the front surface of the semiconductor substrate 1. A portion of the semiconductor substrate 1 excluding the p-type base region 3 and a later-described $p^+$-type collector region 15 constitutes an n-type drift region 2. In the p-type base region 3, the $n^+$-type emitter region 4 and the $p^+$-type contact region 5 are each selectively provided in the surface layer of the semiconductor substrate 1, at the front side of the semiconductor substrate 1.

The gate trenches 6 penetrate through the $n^+$-type emitter region 4 and the p-type base region 3, and reach the n-type drift region 2. A width of the gate trenches 6, for example, may be about 1.5 μm or less. A depth of the gate trenches 6 may be in a range of 5 μm to 6 μm. The gate insulating film 7 is provided along inner walls of the gate trenches 6, respectively. The gate electrodes 8 are provided on the gate insulating film 7 in the gate trenches 6, respectively. The gate electrodes 8 face the $n^+$-type emitter region 4 with the gate insulating film 7 at sidewalls of the gate trenches 6 intervening therebetween. The gate electrodes 8, for example, may contain a polysilicon (poly-Si).

Between adjacent gate trenches among the gate trenches 6 (mesa region), a trench (emitter trench) 9*a* is provided apart from the gate trenches 6. A distance between adjacent gate trenches among the gate trenches 6, for example, may be about 5 μm or less. The emitter trench 9*a* reaches the p-type base region 3. A depth of the emitter trench 9*a* is shallower than depths of the $n^+$-type emitter region 4 and the $p^+$-type contact region 5. At sidewalls of the emitter trench 9*a*, the $n^+$-type emitter region 4 is exposed and at a bottom of the emitter trench 9*a*, the p-type base region 3 and the $p^+$-type contact region 5 are exposed. The emitter trench 9*a* constitutes a later-described contact hole 9.

On the front surface of the semiconductor substrate 1, an interlayer insulating film 13 is provided so as to cover the gate electrodes 8. The interlayer insulating film 13, for example, may be formed by two layers including a HTO film 13*a* and a BPSG 13*b*. A thickness of the interlayer insulating film 13, for example, may be in a range of about 800 nm to 1200 nm.

In a portion of the interlayer insulating film 13 facing the emitter trench 9*a*, the trench-contact contact hole 9*b* that penetrates through the interlayer insulating film 13 in the depth direction and reaches the semiconductor substrate 1 is provided. The depth direction is a direction from the front surface of the semiconductor substrate 1 to the back surface thereof. The trench-contact contact hole 9*b* is continuous with the emitter trench 9*a* and configures the contact hole 9. In a cross-sectional view, the contact hole 9 may have a substantially rectangular shape with a constant width from an opening side to a bottom side, or may have a substantially trapezoidal shape with a width that progressively decreases from the opening side toward the bottom side.

As depicted in FIG. 1A, a width w2 of the $p^+$-type contact region 5 is less than a width w1 of the bottom of the contact hole 9. In more detail, as described in the method of manufacturing the semiconductor device according to the embodiment, the $p^+$-type contact region 5 is formed by implanting impurity ions in a range that is narrower than a width of the bottom of the contact hole 9. As a result, a distance D2 between the contact hole 9 and the gate trenches 6 may be reduced without limiting diffusion of the impurity in the horizontal direction, thereby, enabling reduction of the mesa width.

In the embodiment, the ion-implanted impurity is diffused by a heat treatment in the manufacturing process, whereby the width w2 of the $p^+$-type contact region 5 may become larger than the width w1 of the bottom of the contact hole 9. Nonetheless, even in this instance, compared to an instance of the conventional techniques, the width w2 of the $p^+$-type contact region 5 is narrow and therefore, is effective in reducing the mesa width.

When a distance D1 between the $p^+$-type contact region 5 and the gate trenches 6 is, for example, 0.15 μm or less, Vth increases and therefore, in the embodiment, preferably, the distance D1 may be set to be greater than, for example, 0.15 μm. Further, when the width w1 of the bottom of the contact hole 9 is, for example, about 0.35 μm, preferably, the width w2 of the $p^+$-type contact region 5 may be set to, for example, about 0.25 μm and the $p^+$-type contact region 5 may be about 0.05 μm narrower than the bottom of the contact hole 9, on one side. The $p^+$-type contact region 5 is set to be about 0.05 μm narrower than the bottom of the contact hole 9, on one side, whereby increases of Vth due to an effect of the $p^+$-type contact region 5 may be prevented.

In an instance in which the contact hole 9 is formed in a striped layout as viewed from the front side of the semiconductor substrate 1, the width w1 of the bottom of the contact hole 9 is a length in a transverse direction of the bottom of the contact hole 9. In an instance in which the contact hole 9 is formed in a matrix-like layout as viewed from the front side of the semiconductor substrate 1, the width w1 of the bottom of the contact hole 9 is a diameter (contact diameter) of the bottom of the contact hole 9 when the contact hole 9 has a substantially round shape in a plan view, or a length of each side of the bottom of the contact hole 9 when the contact hole 9 has a substantially rectangular shape in a plan view.

The contact hole 9 may be embedded with a metal plug 22 via a barrier metal 21. The barrier metal 21, for example, may be a film that contains titanium (Ti) as a main constituent. The metal plug 22, for example, may contain tungsten (W) as a main constituent. On the interlayer insulating film 13, the emitter electrode (second electrode layer) 14 is provided. The emitter electrode 14 is electrically connected to the $n^+$-type emitter region 4 and the $p^+$-type contact region 5 via the barrier metal 21 and the metal plug 22.

In an instance in which the barrier metal 21 is formed in the contact hole 9, a taper angle θ of the contact hole 9 may preferably be in a range of 84 degrees to 90 degrees. The barrier metal 21 may be formed at the bottom and the sidewalls of the contact hole 9. The barrier metal 21 may be further formed on the interlayer insulating film 13. The barrier metal 21 on the interlayer insulating film 13 may be removed. The taper angle θ may be suitably adjusted according to the method of formation of the barrier metal 21. The barrier metal 21 may be formed by a CVD method or a sputtering method.

In an instance in which the barrier metal 21 is formed by a CVD method, the taper angle θ of the contact hole 9 may preferably be in a range of 88 degrees to 90 degrees. Formation of the barrier metal 21 by a CVD method enables formation of the barrier metal 21 having a uniform film thickness at the bottom and sidewalls of the contact hole 9. Further, setting the taper angle θ to be in a range of 88 degrees to 90 degrees reduces a width of an upper portion of the contact hole 9 when the bottom of the contact hole 9 is formed having the desired width w1 and thus, is effective in reducing the mesa width. Further, the taper angle θ is set to be in a range of 88 degrees to 90 degrees, whereby even when an amount of a polymer 17 deposited on the sidewalls of the contact hole 9 is small, an opening width w3 may be reduced.

In an instance in which the barrier metal 21 is formed by a sputtering method, preferably, the taper angle θ of the contact hole 9 may be in a range from 84 degrees to less than 88 degrees (84 degrees≤θ<88 degrees). When the barrier metal 21 is formed by a sputtering method and the taper angle θ is about 90 degrees, forming the barrier metal 21 to have a uniform film thickness at the bottom and the sidewalls of the contact hole 9 is difficult. By setting the taper angle θ to be less than 88 degrees, the barrier metal 21 may be deposited ensuring step-coverage at the bottom and the sidewalls of the contact hole 9. Further, by setting the taper angle θ to be at least 84 degrees, the contact hole 9 may be formed while spreading of the mesa width is suppressed.

In a surface layer of the semiconductor substrate 1, at the back surface of the semiconductor substrate 1, a $p^+$-type collector region (fourth semiconductor region of the second conductivity type) 15 is provided. In an entire area of the back surface of the semiconductor substrate 1, a collector electrode (second electrode) 16 is provided. At the back surface of the semiconductor substrate 1, the collector electrode 16 is in contact with and electrically connected to the $p^+$-type collector region 15.

Figure 2:
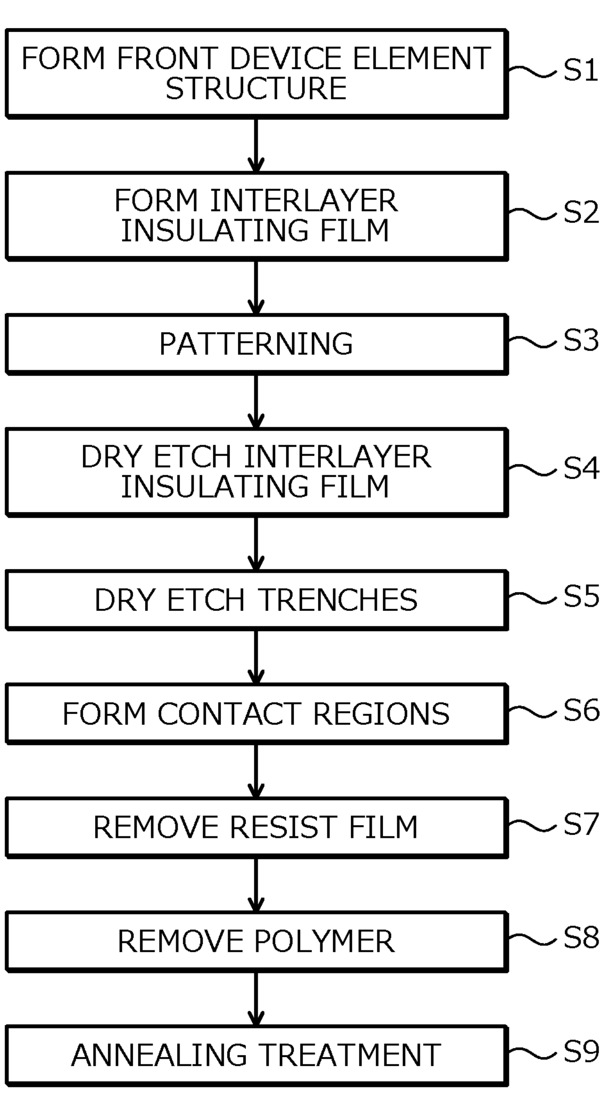
FIG. 2 is a flowchart depicting an outline of a method of manufacturing the semiconductor device according to the embodiment.
Figure 3:
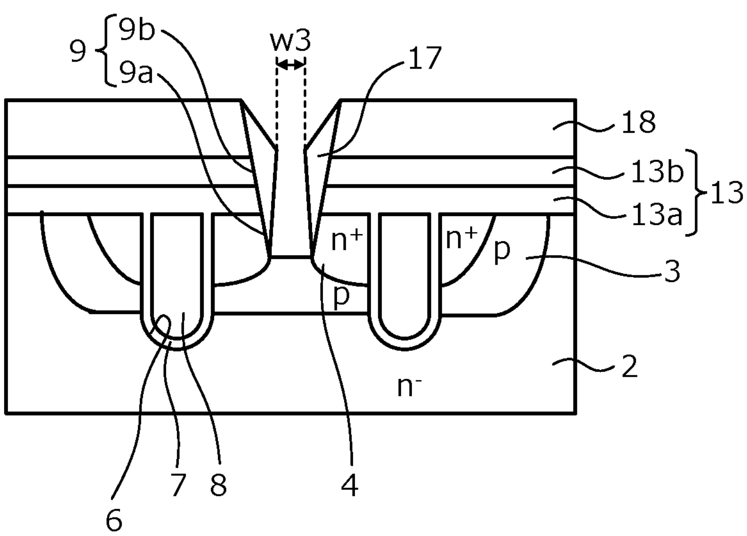
FIG. 3 is a cross-sectional view depicting a state of the semiconductor device according to the embodiment during manufacture.
Figure 4:
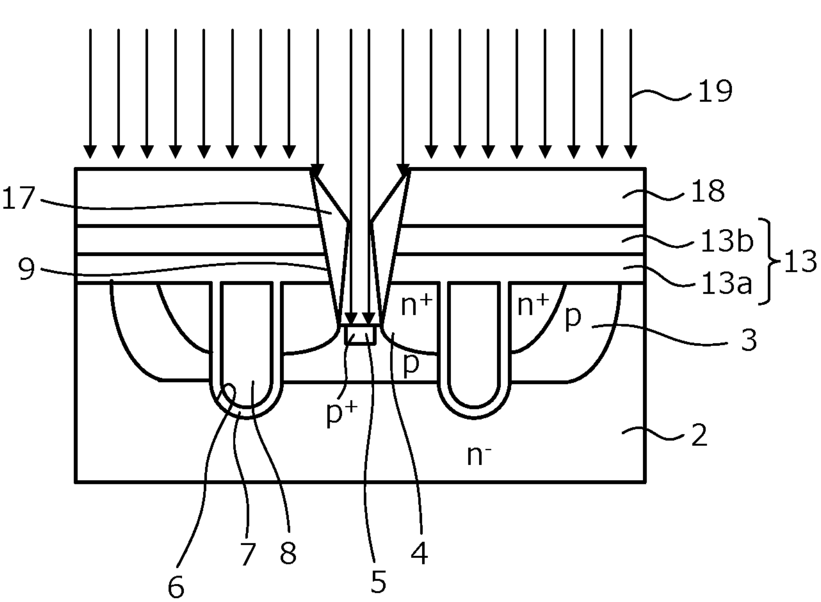
FIG. 4 is a cross-sectional view depicting a state of the semiconductor device according to the embodiment during manufacture.
Figure 5:
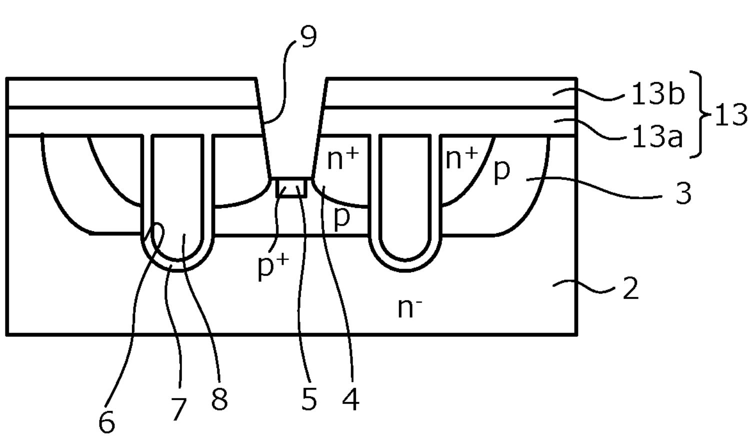
FIG. 5 is a cross-sectional view depicting a state of the semiconductor device according to the embodiment during manufacture.

Next, a method of manufacturing the semiconductor device according to the embodiment is described. FIG. 2 is a flowchart depicting an outline of the method of manufacturing the semiconductor device according to the embodiment. FIGS. 3, 4, and 5 are cross-sectional views depicting states of the semiconductor device according to the embodiment during manufacture. First, as depicted in FIG. 3, on the front side of the semiconductor substrate (semiconductor wafer) 1 containing, for example, silicon, front surface element structures such as the MOS gate portion of the trench gate IGBT 10 are formed (step S1: first process to fifth process). Here, the MOS gate portion to be formed includes structures other than the $p^+$-type contact region 5.

For example, as described next, the front surface element structures are formed. First, the semiconductor substrate 1 that constitutes the n-type drift region 2 is prepared. Next, on the surface of the semiconductor substrate 1, an ion implantation mask (not depicted) having a predetermined opening is formed by a photolithographic technique using, for example, photoresist. The opening is formed at a position where the p-type base region 3 is to be provided. The ion implantation mask is used as a mask and ion implantation of a p-type impurity such as, for example, boron (B) is performed. By this ion implantation, the p-type base region 3 in which a p-type impurity is implanted is formed in the surface layer of the semiconductor substrate 1 (first process).

Next, on the surface of the semiconductor substrate 1, an ion implantation mask (not depicted) having a predetermined opening is formed by a photolithographic technique, using, for example, a photoresist. The opening is formed at a position where the $n^+$-type emitter region 4 that is formed in the p-type base region 3 is to be provided. The ion implantation mask is used as a mask and ion implantation of an n-type impurity such as, for example, phosphorus (P) or arsenic (As) is performed. By this ion implantation, the $n^+$-type emitter region 4 in which an n-type impurity is implanted is formed in a surface layer of the p-type base region 3 (second process).

Next, on the surface of the p-type base region 3, a trench forming mask having predetermined openings is formed by photolithography, using, for example, an oxide film. Next, the gate trenches 6 that penetrate through the p-type base region 3 and the $n^+$-type emitter region 4, and reach the semiconductor substrate 1 are formed by dry etching (third process).

Next, the gate insulating film 7 is formed along the surface of the $n^+$-type emitter region 4 and the bottoms and sidewalls of the gate trenches 6 (fourth process). The gate insulating film 7 may be formed by thermal oxidation. The gate insulating film 7 may be formed by a CVD method. Next, a multicrystalline silicon layer doped with, for example, phosphorus atoms is provided on the gate insulating film 7. The multicrystalline silicon layer may be formed so as to be embedded in the gate trenches 6. The multicrystalline silicon layer may be formed by a CVD method. The multicrystalline silicon layer is patterned by photolithography and left in the gate trenches 6, thereby forming the gate electrodes 8 (fifth process).

Next, the interlayer insulating film 13 is formed in the entire front surface of the semiconductor substrate 1 so as to cover the gate electrodes 8 of the trench gate IGBT 10 (step S2: sixth process). The interlayer insulating film 13 may be formed by, for example, forming the HTO film 13*a* and depositing the BPSG 13*b* on the HTO film 13*a*. The HTO film 13*a* and the BPSG 13*b* may be formed by a CVD method. Next, the interlayer insulating film 13 may be planarized by a heat treatment (reflow) or chemical mechanical polishing (CMP), etc, and coat-ability (step-coverage) of a front electrode may be improved. Next, on the interlayer insulating film 13, patterning including photoresist application, exposure, a developing process is performed (step S3), thereby forming a resist film 18 in which a predetermined region is opened.

The resist film 18 has an opening at a portion that corresponds to a formation region of the contact hole 9 of the trench gate IGBT 10. Next, as depicted in FIG. 3, dry etching is performed using the resist film 18 as a mask, and the interlayer insulating film 13 is selectively removed (step S4: seventh process). The dry etching at step S4 is performed using, for example, a fluorine (f)-based gas such as trifluoromethane ($CHF_3$) gas or carbon tetrafluoride ($CF_4$) gas (F) and using F-radicals in plasma generated in a chamber (furnace). By the dry etching at step S4, in a portion exposed by the opening of the resist film 18, the trench-contact contact hole 9*b* that penetrates through the interlayer insulating film 13 in the depth direction and reaches the front surface of the semiconductor substrate 1 is formed.

Next, as depicted in FIG. 3, the resist film 18 is used as a mask and in the portion exposed by the opening of the resist film 18, the semiconductor substrate 1 (silicon portion) is dry-etched using the F-radical in the plasma, thereby forming the emitter trench 9*a* at a predetermined depth and continuous with the trench-contact contact hole 9*b* (step S5: seventh process). As a result, the contact hole 9 constituted by the emitter trench 9*a* and the trench-contact contact hole 9*b* is formed.

In the processes at step S4 and step S5, as one example, an etching process of etching the interlayer insulating film 13 and/or the semiconductor substrate 1 (silicon portion), and a depositing process of depositing the polymer 17 on the sidewalls of the contact hole 9 to protect the sidewalls of the contact hole 9 may be alternately performed, repeatedly, as a single process to, thereby form the contact hole 9 of the predetermined depth. Thus, the polymer 17 is deposited at the sidewalls of the contact hole 9. The polymer 17 is a reaction product generated by constituents contained in the gas supplied during the treatment at step S4 and step S5, and contains a large amount of the constituents of the resist film 18. The polymer 17 may cover an entire area of the sidewalls of the contact hole 9 and the film thickness of the polymer 17 may be thickest near an interface between the resist film 18 and the interlayer insulating film 13.

Next, as depicted in FIG. 4, an ion implantation 19 of a p-type impurity such as B is performed from the front side of the semiconductor substrate 1, whereby the $p^+$-type contact region 5 is formed in the surface layer of the p-type base region 3 exposed at the bottom of the contact hole 9 (step S6: eighth process). In the embodiment, before the polymer 17 is removed, the ion implantation 19 is performed. In this manner, the ion implantation 19 is performed using, as a mask, the polymer 17, which is a by-product deposited during the etching of the contact hole 9. The polymer 17 is deposited on the sidewalls of the contact hole 9 and therefore, an opening of the polymer 17 has width w3 that is narrower than that of the opening of the resist film 18. Thus, the distribution range of the impurity implanted by the ion implantation 19 may be limited to a narrow range by a processing dimension of the opening of the resist film 18 and a processing dimension of the contact hole 9.

In this manner, the distribution range of the impurity is narrow and therefore, even when the impurity is distributed in the horizontal direction due to scattering that occurs in Si during the ion implantation, the $p^+$-type contact region 5 may be prevented from spreading more than the processing dimension, that is, more than the width of the bottom of the contact hole 9. Therefore, in the method of manufacture in the embodiment, the width w2 of the $p^+$-type contact region 5 may be set to be narrower than the width w1 of the bottom of the contact hole 9.

Further, the polymer 17 is deposited on the sidewalls of the contact hole 9 and therefore, the sidewalls of the contact hole 9 may prevent the impurity implanted by the ion implantation 19 from being implanted in the $n^+$-type emitter region 4. As a result, the resistance when the $n^+$-type emitter region 4 and the emitter electrode 14 are electrically connected may be reduced.

Further, a similar structure may also be formed by forming, on the interlayer insulating film 13, a metal film having an opening, selectively retracting the interlayer insulating film 13 by side-etching, and performing ion implantation through the metal film. However, with this method, processes have to be added, requiring a greater cost than that of the method of manufacturing according to the embodiment.

Further, in the method of manufacturing according to the embodiment, when the contact hole 9 is formed, the polymer 17, which is a deposited by-product, is generated corresponding to gas conditions and power conditions during the etching and by advancing the etching while protecting the sidewalls of the opening, the taper angle θ of the sidewalls is controlled. The taper angle θ is an angle formed by the sidewalls and the bottom of the contact hole 9 (refer to FIG. 1A). The polymer 17 thickly adheres to the sidewalls under etching conditions that facilitate generation of the polymer 17 and the etching taper shape becomes close to vertical whereas the taper angle becomes large and oblique under conditions by which the polymer 17 is thin.

For example, the taper angle θ of the sidewalls may be controlled by the power for generating the plasma during the dry etching. By increasing the power, a large amount of the polymer 17 is generated and the taper angle θ decreases, and by decreasing the power, a small amount of the polymer 17 is generated and the taper angle θ increases.

Next, the barrier metal 21 is formed on the bottom and the sidewalls of the contact hole 9. In an instance in which the barrier metal 21 is formed on the bottom and the sidewalls of the contact hole 9, the taper angle θ of the contact hole 9 suffices to be in a range of 84 degrees to 90 degrees.

The barrier metal 21 is formed on the bottom and the sidewalls of the contact hole 9. The interlayer insulating film 13 may be free of the barrier metal 21. The barrier metal 21 may be formed on the interlayer insulating film 13. The barrier metal 21 may be formed by a CVD method or a sputtering method. The taper angle θ may be adjusted according to the method of formation of the barrier metal 21.

In an instance in which a barrier metal layer is formed by a CVD method, preferably, the taper angle θ may be in a range of 88 degrees to 90 degrees. The barrier metal 21 is formed by a CVD method, whereby the barrier metal 21 may be formed having a uniform film thickness at the bottom and the sidewalls of the contact hole 9. Further, setting the taper angle θ to be at least 88 degrees reduces the width of the upper portion of the contact hole 9 when the bottom of the contact hole 9 is formed having the desired width w1 and therefore, is effective in reducing the mesa width. Further, by setting the taper angle θ to be in a range of 88 degrees to 90 degrees, the opening width w3 may be reduced even when the amount of the polymer 17 deposited on the sidewalls of the contact hole 9 is small.

In an instance in which the barrier metal layer is formed by a sputtering method, preferably, the taper angle θ may be in a range of 84 degrees to less than 88 degrees (84 degrees≤θ<88 degrees). When the barrier metal 21 is formed by a sputtering method and the taper angle θ is about 90 degrees, forming the barrier metal 21 to have a uniform film thickness at the bottom and the sidewalls of the contact hole 9 is difficult. By setting the taper angle θ to be less than 88 degrees, the barrier metal 21 may be deposited ensuring step-coverage at the bottom and the sidewalls of the contact hole 9. By setting the taper angle θ to be at least 84 degrees, the contact hole 9 may be formed while spreading of the mesa width is suppressed.

The polymer 17 at the sidewalls of the contact hole 9 is deposited during the dry etching, as described above. After finishing or while shaping the contact hole 9 to have the desired tapered shape by etching, the polymer 17 may be caused to be deposited on the side walls as a condition facilitating generation of the polymer 17. The amount of the polymer 17 deposited on the sidewalls of the contact hole 9 may be adjusted according to the size of the taper angle θ.

Figure 6:
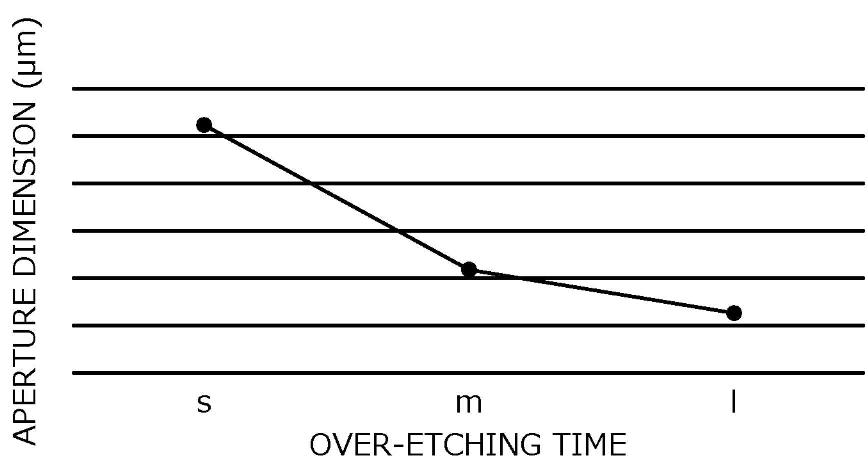
FIG. 6 is a graph depicting a relationship between overetching time and opening dimension.
Figure 8:
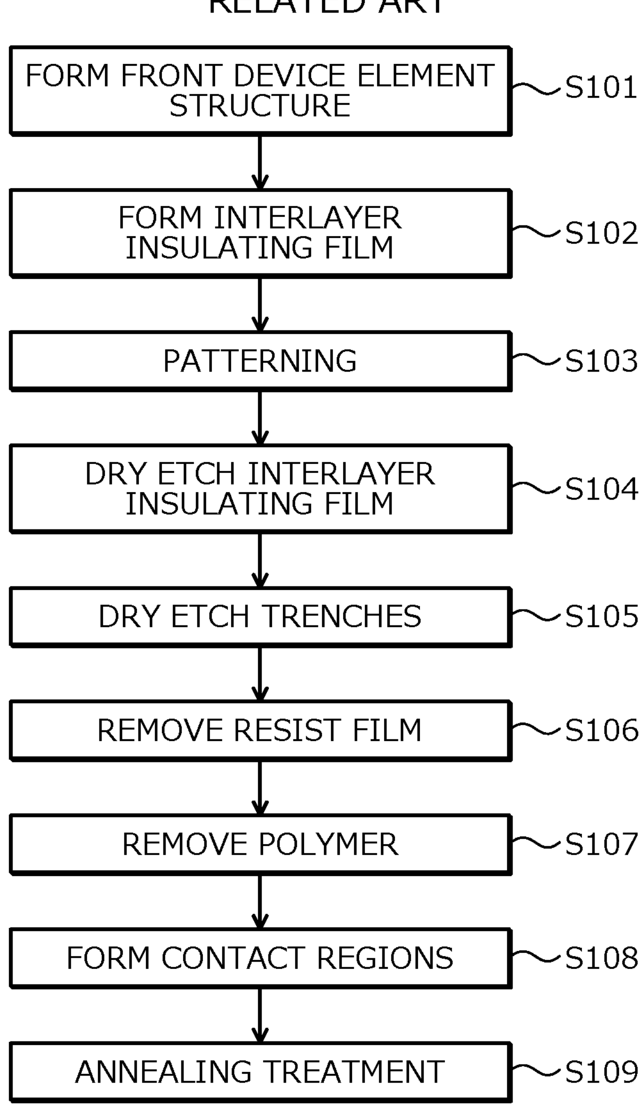
FIG. 8 is a flowchart depicting an outline of a method of manufacturing the conventional semiconductor device.
Figure 11:
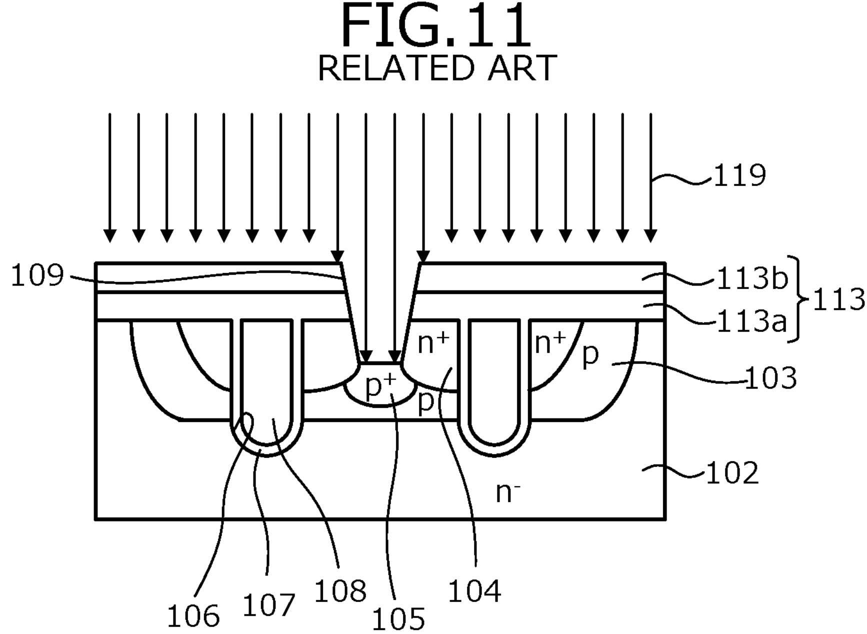
FIG. 11 is a cross-sectional view depicting a state of the conventional semiconductor device during manufacture.

Here, FIG. 6 is a graph depicting a relationship between over-etching time and opening dimension. In FIG. 6, a horizontal axis indicates over-etching time, "s" indicates a short over-etching time, "I" indicates a long over-etching time, and "m" indicates an intermediate over-etching time between "s" and "I". A vertical axis indicates opening dimension. The over-etching time is the time that the etching is further performed under the same conditions (gas, power for generating plasma, etc.), after the contact hole 9 is etched to a desired depth. The opening dimension is the width of the opening of the polymer 17 deposited on the sidewalls of the contact hole 9 (w3 in FIG. 3).

As depicted in FIG. 6, the longer is the over-etching time, the narrower is the opening dimension. Therefore, the opening dimension may be set to a desired width by adjusting the over-etching time. The width w2 of the $p^+$-type contact region 5 is a sum of the width w3 of the opening and two times a width w4 (not depicted) that the impurity diffuses in the horizontal direction due to scattering occurring in Si during ion implantation (w2=w3+2×w4) and thus, by adjusting the over-etching time and setting the opening dimension to a desired width, the width w2 of the $p^+$-type contact region 5 may be set to be narrower than the width w1 of the bottom of the contact hole 9.

Next, as depicted in FIG. 5, the resist film 18 is removed by a dissolution treatment using a chemical solution, an ashing treatment using oxygen, a peeling treatment using amine-based peeling solution, etc. (step S7). Next, the polymer 17 remaining in the contact hole 9 is lifted and removed (lift-off) by a dissolution treatment using a chemical solution (for example, SPM cleaning using an aqueous solution of sulfuric acid and hydrogen peroxide ($H_2SO_4/H_2O_2/H_2O$), SC1 cleaning using a mixed aqueous solution of $H_2O_2$ (hydrogen peroxide) and ammonia ($NH_3$)) (step S8: ninth process).

Next, a heat treatment (activation annealing) for activating the $p^+$-type contact region 5 formed by ion implantation is performed (step S9). For example, a heat treatment (annealing) under an inert gas atmosphere of about 1000 degrees C. is performed and implementing the heat treatment for activating the $p^+$-type contact region 5 separate from an activation heat treatment for the p-type base region 3, the $n^+$-type emitter region 4, and the $p^+$-type contact region 5 may further suppress spreading of the impurity due to diffusion and therefore, may be preferable. Activation treatment of the $p^+$-type contact region 5, for example, suffices to be performed by a rapid thermal annealing (RTA) method, at a temperature in a range of 800 degrees to 1000 degrees C., for 10 seconds to 30 seconds so as to suppress spreading of the impurity due to diffusion.

Next, the barrier metal 21 is formed in the entire front surface of the semiconductor substrate 1. The barrier metal 21, as described above, may be formed by a CVD method or a sputtering method. Next, the metal plug 22 is formed so as to be embedded in the contact hole 9. The metal plug 22 may contain tungsten (W). The metal plug 22 may be formed so as to be embedded in the contact hole 9 by forming a tungsten film in the entire front surface of the semiconductor substrate 1 and performing etching. The barrier metal 21 of the front surface of the semiconductor substrate 1 may be removed together with the tungsten film when the tungsten film is etched.

Next, the emitter electrode 14 is formed in the entire front surface of the semiconductor substrate 1 (the eleventh process). The emitter electrode 14 is a metal film containing, for example, aluminum (Al) as a main constituent. The emitter electrode 14, for example, is formed by a sputtering method. The emitter electrode 14 is electrically connected to the $n^+$-type emitter region 4 and the $p^+$-type contact region 5 via the barrier metal 21 and the metal plug 22 in the contact hole 9. Next, the $p^+$-type collector region 15 and the collector electrode 16 are formed at the back surface of the semiconductor substrate 1 (tenth process, twelfth process). The collector electrode 16 is a metal film containing, for example, aluminum (Al) as a main constituent. The collector electrode 16, for example, is formed by a sputtering method. Thereafter, the semiconductor substrate 1 is cut into individual chips, whereby the semiconductor device depicted in FIG. 1A is completed.

As described above, according to the embodiment, the width of the $p^+$-type contact region is narrower than the width of the bottom of the contact hole. As a result, the distance between the contact hole and the gate electrodes may be increased without limiting diffusion in the horizontal direction and the mesa width may be reduced.

Further, according to the method of manufacturing according to the embodiment, before the polymer is removed, ion implantation is performed. The polymer is adhered to the sidewalls of the contact hole and therefore, the opening of the polymer is narrower than the opening of the resist film. As a result, the distribution range of the impurity implanted by the ion implantation may be limited to a narrow range by the processing dimension of the opening of the resist film and the processing dimension of the contact hole. Thus, the width of the $p^+$-type contact region may be set to be narrower than the width of the bottom of the contact hole.

In the foregoing, the present invention may be variously modified within a range not departing from the spirit of the invention and in the described embodiments, for example, dimensions and impurity concentrations of components may be variously set according to necessary specifications. For example, in the described embodiments, while description is given taking an IGBT as an example, instead of an IGBT, a MOSFET may be used. Further, instead of silicon, a material of the semiconductor substrate may be silicon carbide (SiC). Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, the width of the $p^+$-type contact region is narrower than the width of the bottom of the contact hole. As a result, the distance between the contact hole and the gate electrodes may be increased without limiting diffusion of the impurity in the horizontal direction and the mesa width may be reduced.

Further, before the polymer is removed, ion implantation is performed. The polymer is attached to the sidewalls of the contact hole and therefore, the opening of the polymer is narrower than the opening of the resist film. As a result, the distribution range of the impurity implanted by the ion implantation may be limited to a narrow range by the processing dimension of the opening of the resist film and the processing dimension of the contact hole. Thus, the width of the $p^+$-type contact region may be set to be narrower than the width of the bottom of the contact hole.

The method of manufacturing a semiconductor device and the semiconductor device according to the present invention achieve an effect in that the width of the $p^+$-type contact region is reduced, whereby the mesa width may be reduced.

As described above, the method of manufacturing a semiconductor device and the semiconductor device according to the present invention are useful for power semiconductor devices used in power converting equipment such inverters, power source devices such as those of various types of industrial machines, igniters of automobiles, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:

a semiconductor substrate of a first conductivity type, the semiconductor substrate having a first main surface and a second main surface that are opposite to each other;

a first semiconductor region of a second conductivity type selectively provided in the semiconductor substrate, at the first main surface of the semiconductor substrate, the first semiconductor region having a first surface and a second surface that are opposite to each other, the second surface facing the semiconductor substrate;

a second semiconductor region of the first conductivity type, selectively provided in the first semiconductor region, at the first surface of the first semiconductor region;

a trench that penetrates through the first semiconductor region and the second semiconductor region and reaches the semiconductor substrate;

a gate insulating film provided in the trench, along a bottom and sidewalls of the trench;

a gate electrode provided on the gate insulating film, in the trench;

an interlayer insulating film that covers the gate electrode;

a contact hole that penetrates through the interlayer insulating film and reaches the first semiconductor region;

a third semiconductor region of the second conductivity type, provided in the first semiconductor region exposed at a bottom of the contact hole;

a fourth semiconductor region of the second conductivity type, provided at the second surface of the semiconductor substrate;

a first electrode provided on a surface of the first semiconductor region and a surface of the second semiconductor region; and a second electrode provided at a surface of the fourth semiconductor region, wherein in a horizontal direction parallel to the first main surface, the third semiconductor region has a width that is smaller than a width of a bottom of the contact hole, and the bottom of the contact hole is in direct contact with the first semiconductor region.

2. The semiconductor device according to claim 1, wherein the bottom and a sidewall of the contact hole form an angle in a range of 84 degrees to 90 degrees.

3. The semiconductor device according to claim 1, wherein a sidewall of the contact hole is directly adjacent to the second semiconductor region.

4. The semiconductor device according to claim 1, wherein a bottom of the contact hole is located beneath the first main surface of the semiconductor substrate.

5. The semiconductor device according to claim 1, wherein the third semiconductor region is provided entirely within the first semiconductor region.

6. The semiconductor device according to claim 1, wherein in a depth direction from the first main surface toward the second main surface, the width of the contact hole gradually decreases from a top toward the bottom.

7. A semiconductor device, comprising:

a semiconductor substrate of a first conductivity type, the semiconductor substrate having a first main surface and a second main surface that are opposite to each other;

a first semiconductor region of a second conductivity type selectively provided in the semiconductor substrate, at the first main surface of the semiconductor substrate, the first semiconductor region having a first surface and a second surface that are opposite to each other, the second surface facing the semiconductor substrate;

a second semiconductor region of the first conductivity type, selectively provided in the first semiconductor region, at the first surface of the first semiconductor region;

a trench that penetrates through the first semiconductor region and the second semiconductor region and reaches the semiconductor substrate;

a gate insulating film provided in the trench, along a bottom and sidewalls of the trench;

a gate electrode provided on the gate insulating film, in the trench;

an interlayer insulating film that covers the gate electrode;

a contact hole that penetrates through the interlayer insulating film and reaches the first semiconductor region;

a third semiconductor region of the second conductivity type, provided in the first semiconductor region exposed at a bottom of the contact hole;

a fourth semiconductor region of the second conductivity type, provided at the second surface of the semiconductor substrate;

a first electrode provided on a surface of the first semiconductor region and a surface of the second semiconductor region; and a second electrode provided at a surface of the fourth semiconductor region, wherein in a horizontal direction parallel to the first main surface, the third semiconductor region has a width that is smaller than a width of a bottom of the contact hole, wherein the bottom and a sidewall of the contact hole form an angle θ in a range 84 degrees≤θ<88 degrees.

8. A method of manufacturing the semiconductor device according to claim 1, the method comprising:

preparing the semiconductor substrate of the first conductivity type;

selectively forming the first semiconductor region of the second conductivity type in the semiconductor substrate, at the first main surface of the semiconductor substrate;

selectively forming the second semiconductor region of the first conductivity type, the second semiconductor region being formed in the first semiconductor region, at the first surface of the first semiconductor region;

forming the trench that penetrates through the first semiconductor region and the second semiconductor region, and reaches the semiconductor substrate;

forming the gate insulating film in the trench, along the bottom and sidewalls of the trench;

forming the gate electrode on the gate insulating film, in the trench;

forming the interlayer insulating film that covers the gate electrodes;

forming the contact hole that penetrates through the interlayer insulating film and reaches the first semiconductor region;

performing an ion implantation using, as a mask, a polymer that is formed together with the contact hole, on sidewalls of the contact hole, and thereby form the third semiconductor region of the second conductivity type in the first semiconductor region that is exposed at the bottom of the contact hole;

removing the polymer after performing the ion implantation;

forming the fourth semiconductor region of the second conductivity type at the second main surface of the semiconductor substrate;

forming the first electrode on the surface of the first semiconductor region and the surface of the second semiconductor region; and forming the second electrode on the surface of the fourth semiconductor region.

9. The method according to claim 8, wherein forming the contact hole includes depositing the polymer on sidewalls of the contact hole in such a manner that in a horizontal direction parallel to the first main surface, a sum of a width of an opening formed by the polymer and two times a width that an impurity diffuses in the horizontal direction during the ion implantation is smaller than a width of the bottom of the contact hole.

10. The method according to claim 9, wherein forming the contact hole further includes over-etching to thereby adjust the width of the opening of the polymer in the contact hole.

* * * * *